(12) United States Patent
Aitren et al.

(10) Patent No.: US 6,788,093 B2
(45) Date of Patent: Sep. 7, 2004

(54) METHODOLOGY AND APPARATUS USING REAL-TIME OPTICAL SIGNAL FOR WAFER-LEVEL DEVICE DIELECTRICAL RELIABILITY STUDIES

(75) Inventors: John M. Aitren, South Burlington, VT (US); Fen Chen, Williston, VT (US); Kevin L. Condon, Essex Junction, VT (US); Mark F. Dionne, Burlington, VT (US); Gregory E. Nuttall, Milton, VT (US)

(73) Assignee: International Business Machines Corporation, Armonk, NY (US)

( * ) Notice: Subject to any disclaimer, the term of this patent is extended or adjusted under 35 U.S.C. 154(b) by 67 days.

(21) Appl. No.: 10/213,882

(22) Filed: Aug. 7, 2002

(65) Prior Publication Data
US 2004/0027149 A1 Feb. 12, 2004

(51) Int. Cl.[7] .................................. G01R 31/26
(52) U.S. Cl. ........................ 324/765; 324/751
(58) Field of Search .............. 324/158.1, 752, 324/751, 765, 766; 356/237.1, 237.2, 237.3, 237.4, 237.5, 237.6, 237; 250/484.1; 382/145

(56) References Cited

U.S. PATENT DOCUMENTS

| | | | |
|---|---|---|---|
| 4,680,635 A | * 7/1987 | Khurana | 348/79 |
| 4,755,874 A | * 7/1988 | Esrig et al. | 348/126 |
| 4,845,425 A | 7/1989 | Beha et al. | |
| 5,006,717 A | * 4/1991 | Tsutsu et al. | 250/484.2 |
| 5,519,334 A | 5/1996 | Dawson | |
| 5,897,327 A | 4/1999 | Asano et al. | |
| 5,930,588 A | 7/1999 | Paniccia | |
| 5,963,040 A | 10/1999 | Liu | |
| 5,963,783 A | 10/1999 | Lowell et al. | |
| 5,981,967 A | 11/1999 | Luo | |
| 6,051,828 A | 4/2000 | Patterson | |
| 6,113,733 A | 9/2000 | Eriguchi et al. | |
| 6,146,911 A | 11/2000 | Tsuchiya et al. | |
| 6,154,039 A | 11/2000 | Wu | |
| 6,184,046 B1 | 2/2001 | Patterson | |
| 6,202,029 B1 | 3/2001 | Verkuil et al. | |

FOREIGN PATENT DOCUMENTS

JP    10223707 A    8/1998

* cited by examiner

Primary Examiner—Evan Pert
Assistant Examiner—Tung X. Nguyen
(74) Attorney, Agent, or Firm—McGinn & Gibb, PLLC; William D. Sabo, Esq.

(57) ABSTRACT

A method and structure tests devices on a wafer by applying an electrical bias to the devices and simultaneously monitoring emitted light from all of the devices. The emitted light indicates locations of defective devices and records time-based images of the emitted light across the wafer.

17 Claims, 7 Drawing Sheets

METHODOLOGY AND APPARATUS USING REAL-TIME OPTICAL SIGNAL FOR WAFER-LEVEL DEVICE DIELECTRICAL RELIABILITY STUDIES

BACKGROUND OF THE INVENTION

1. Field of the Invention

The present invention generally relates to a system and method for testing the reliability of integrated circuit structures and more particularly to an improved wafer-level dielectric reliability test system and method utilizing the contactless detection of optical signal (photon emission) instead of conventional electrical signals such as voltage, current, and resistance to determine time dependent device failure for large-scale reliability evaluations. The invention isolates defective devices through the use of fuses with a specific test structure design allowing the remaining devices to be continuously emission tested.

2. Description of the Related Art

Reliability evaluation processes such as time-dependent dielectric breakdown stress testing are required for semiconductor manufacturing processes. The purpose of this testing is to ensure qualified technology and to prevent defective and less reliable chips from reaching the user. Current processes heavily utilize constant voltage or current stress testing to evaluate the reliability of the oxide. For the wafer-level stress testing approach, a probe test apparatus is used. In such testing, the probes are brought into physical contact with the electrical pads of one chip of a large number of semiconductor chips on the semiconductor wafer. A constant voltage or a constant current is then applied to one chip at a time by using the probe test apparatus. An output electrical signal (current for constant voltage stress testing or voltage for constant current stress testing) from the stressed chip is monitored by an electric meter thereby testing the wear-out and breakdown characteristics of each semiconductor chip in series. A sudden current increase during the constant voltage stress or a sudden voltage drop during the constant current stress is defined as breakdown of the device.

With continuously aggressive shrinking in very large scale integration (VLSI), dielectric breakdown is considered a major reliability issue for ultra thin gate oxides and storage node dielectrics. An accurate lifetime projection is of great importance to the evaluation of advanced metal oxide semiconductor field, effect transistor (MOSFET) technologies. With the aggressive decreasing of the device dielectric thickness, high leakage current at the stress level, due to direct tunneling, and soft breakdown during the stress impose great challenges for the traditional dielectric time-to-breakdown reliability stress. They introduce more uncertainties and limitations for failure time detection during electrical stress testing. On the other hand, generally, statistically independent sample sizes directly affect the accuracy of oxide stress results. The probability of determining the correct distribution parameters of the population increases with sample size, and a large sample size tightens the confidence bounds. Unfortunately, large-scale oxide reliability evaluations require a large pool of stress equipment and tremendous amount of stress time. The current oxide time-to-breakdown measurements are tedious, costly, and time-consuming.

Using electrical signals such as current and voltage as breakdown detection becomes more difficult as device dielectric thickness is aggressively reduced. Ultra-high leakage current due to direct tunneling in thin dielectric film greatly decreases the breakdown signal to base current ratio. The sudden increase of a stress current signal is much less significant when compared with the base stress current for thin dielectric films and, therefore, is very hard to accurately detect. The use of a small area test device instead of a large area test device is required to overcome the detection resolution problem, as leakage current is proportional to the device area. However, a small test area could greatly reduce the probability of catching the extrinsic defects and it also could limit the size range of area scaling.

With decreasing dielectric thicknesses, dielectric soft breakdown commonly occurs before hard breakdown. The breakdown current after soft breakdown is orders of magnitude smaller than that after hard breakdown and usually induces only a stress current oscillation instead of sharp increase. Thus, soft breakdown of thin dielectric films further aggravates detection problems associated with high stress currents. Furthermore, the oscillation of current during stress testing could be induced by other non-catastrophic events instead of soft and hard breakdown for ultra-thin dielectric films, which raises another great uncertainty for the failure time detection for such films. Therefore, using conventional dielectric time-to-failure reliability stress methodology is of great concern.

For wafer-level stress testing, in order to test all the chips on the wafer, a wafer chuck on which the semiconductor wafer is held is moved vertically up and down and stepped by a distance corresponding to one chip every time after a test on a chip is completed. A disadvantage of wafer-level stress testing is the fact that only one chip is stressed at a time. Therefore, the measurements are time-consuming and the sample sizes are forced to be limited in order to finish the whole stress test within a reasonable time frame. Although module level electrical stress methods could be utilized to procure a large sample size requirement, the cost to build this kind of system with a large quantity of power sources and sophisticated test software is high. Cutting a semiconductor wafer into chips and packaging them increases the cost and time which is also a concern. Furthermore, the reliability of this kind of complex system with multiple power sources is questionable. Thus, while electrical module level stress testing could provide massive parallel stress, the cost (power sources, hardware design, software, maintenance, etc.) of test equipment and module build is also very high. In addition, module level stress testing is not practical lines for process monitoring, controlling, and device screening. Physical defect location, device level process uniformity, and the physical nature of the failure from damaged devices also cannot be determined using such conventional electrical methods.

In order to solve the disadvantages and drawbacks of conventional dielectric reliability tests, there is a need for a new system and methodology that stresses a large number of devices, yet is accurate, simple, reliable, economical, and provides more related information such as physical breakdown locations, signatures of different failures, and device level process uniformity.

SUMMARY OF THE INVENTION

In view of the foregoing and other problems, disadvantages, and drawbacks of the conventional time-dependent dielectric breakdown (TDDB) reliability stress method and hardware systems, the present invention has been devised, and it is an object of the present invention to provide a method and apparatus for better determining dielectric breakdown in a semiconductor device. Instead of monitoring electrical signal change as failure or breakdown detection, the present invention uses an optical signal detection source. The present invention results in a more effective, more precise, faster, and much simpler evaluation method for oxide wear-out and reliability studies.

In order to attain the object(s) suggested above, there is provided, according to one aspect of the invention, a method which tests devices on a wafer. The invention first applies an electrical bias by bringing a testing probe into contact with an outer connecting terminal of all the devices under test on the wafer in parallel. After a long period of degradation, the dielectric eventually undergoes a catastrophic condition to form a conductive filament in the dielectric due to large current flow, which results in a burst of light emission that can easily be detected, recorded, and mapped by photo emission microscopy (e.g. see, U.S. Pat. No. 6,184,046, U.S. Pat. No. 5,981,967, U.S. Pat. No. 4,845,425, JAP PAT. 10223707 incorporated herein by reference). The invention therefore monitors optical signals (emitted light) directly from a breakdown spot within a device, instead of measuring indirect electrical signals, such as voltage or current from the whole device. One optical photon sensor or an integrated photon sensor array is designed to detect light emission from many devices across the wafer simultaneously, in contrast to the conventional electrical method that uses one electrical meter per device or that requires an extra scanner for such parallel stress testing. The time of emitted light change indicates the time of oxide breakdown, and the location of emitted light from the failure device indicates the location of the breakdown. The system records time-based optical signals of the emitted light for all the devices across the wafer.

The invention which uses optical signals instead of electrical signals to detect dielectric time-dependent failure during TDDB reliability stress testing and can be directly incorporated into conventional wafer-level TDDB tests to improve the accuracy of thin dielectric breakdown detection during the stress testing. With the inventive test design in conjunction with the optical signal detection system, the invention further enhances the efficieny of TDDB reliability testing by stressing a large number of devices in parallel on the wafer-level with very limited hardware. During the stress testing, the invention terminates connections between the electrical bias and the failing devices. The invention then continues the monitoring and continues terminating failing devices during the duration of the testing. Time-based images are available in real time during the testing. The invention maps device defects across the wafer on a time-line basis. The invention connects the devices in parallel on the wafer. The terminating process opens fuses to electrically isolate the failed devices from the rest of the devices under test.

The invention also includes a system that tests devices on a wafer. The system has a power source unit that applies one or more electrical biases to all the devices under test using the specific designed test site, and a specialized photon sensor, or photon sensor array, that detects optical signals from many devices under the test across the wafer. The system has an image processor that converts the emitted light into emitted light signals, and a digital recording system that provides time resolution of light intensity change during the stress. A selectable lens optic system is coupled to an image intensifier, which is in turn connected to a spectrum analyzer to determine the wavelength dependent photon intensity. The emitted light signals indicate the times and locations of the failure formation within the devices. The spectral response of the detected light indicates the nature of the failures. The system also has a controller that terminates connections between the electrical bias and the defective devices.

With the real-time image recording, the time of oxide breakdown, the location of breakdown, the change of the light emission intensity during the stress, and the spectral response of the emitted light from breakdown spots provide extensive information regarding oxide wear-out and breakdown physics. With a minimum voltage source (one for regular constant voltage stress) or current source (one for regular constant current stress) and set up (multiple power sources could also be applied to more complex products) which is simple and reliable with very limited hardware, massively parallel stress testing for oxide breakdown can be easily achieved.

BRIEF DESCRIPTION OF THE DRAWINGS

The foregoing and other objects, aspects and advantages will be better understood from the following detailed description of a preferred embodiment(s) of the invention with reference to the drawings, in which.

DETAILED DESCRIPTION OF PREFERRED EMBODIMENTS OF THE INVENTION

The invention uses an optical emission microscopy technique with spectral resolution capabilities for real-time monitoring of the oxide wear out and breakdown process of many devices across the whole wafer simultaneously. With the real-time image recording, the time of oxide breakdown, the location of breakdown, the change of the light emission intensity during the stress, and the spectral response of the emitted light from breakdown spots provide extensive information regarding oxide wear-out and breakdown physics. With inventive test site design, only one voltage source (for regular constant voltage stress) or current source (for regular constant current stress) is required for stressing and monitoring many devices across the wafer simultaneously. The invention utilizes a simple and reliable setup with very limited hardware to achieve fast massively parallel stress for oxide breakdown at the wafer level.

Figure 1A:
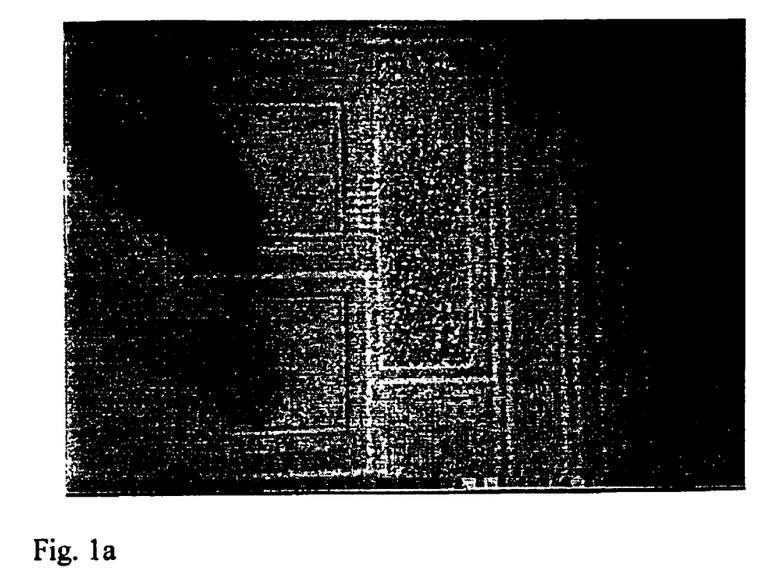
FIG. 1a is a schematic picture showing the photon emission from good a device.
Figure 1B:
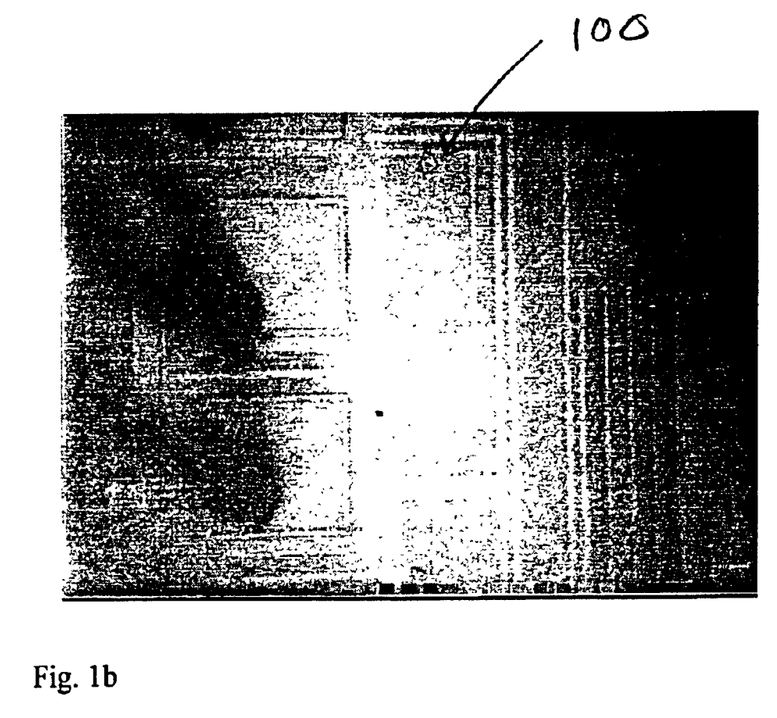
FIG. 1b is a schematic picture showing the photon emission from a defective device.

It is possible for good devices to emit light as well as failing devices, depending on bias conditions. However, the emitted light pattern and intensity are dramatically different between the good and the failing devices as shown in FIGS. 1a–1b. Good devices usually emit uniform light across the whole device as shown in FIG. 1a. However, the failing devices 100 emit very localized light from the failure spots with very high intensity as shown in FIG. 1b. Therefore, it is very easy to distinguish the failing devices from the good devices.

Figure 2:
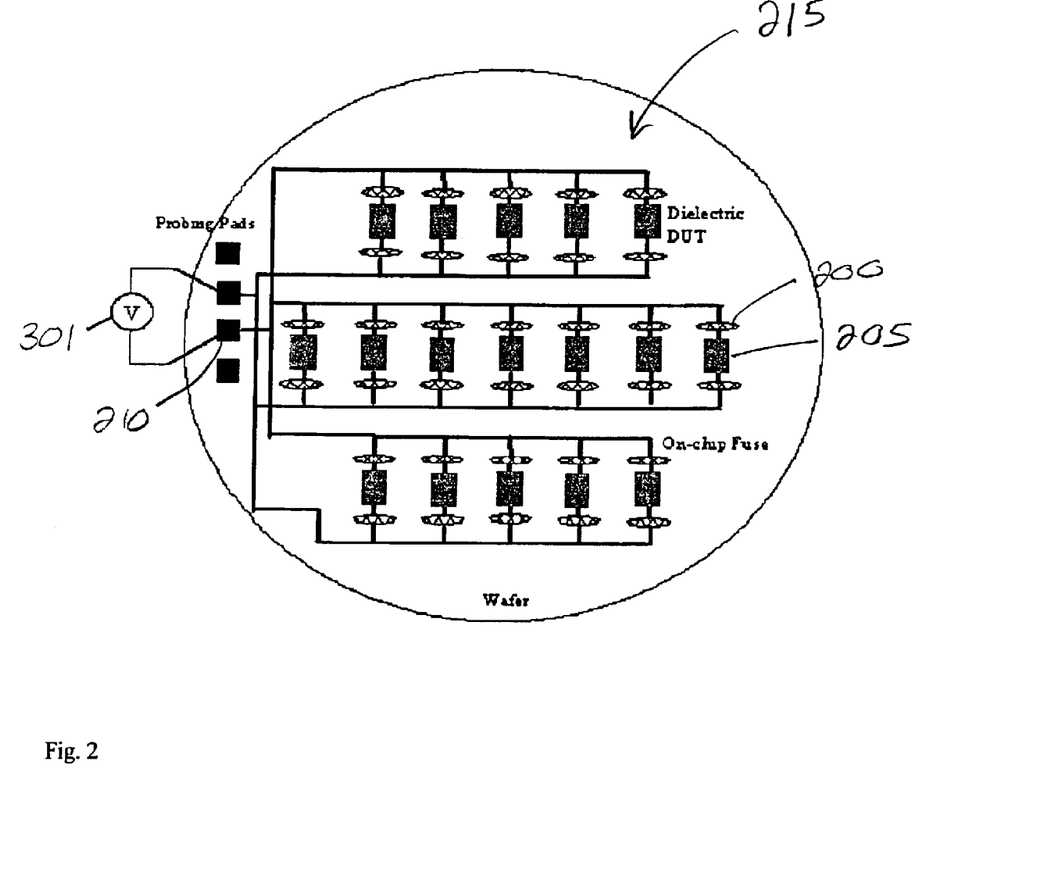
FIG. 2 is a schematic diagram of a device layout showing devices isolated through the use of fuses on the wafer.

FIG. 2 illustrates one exemplary device layout where the devices are isolated through the use of fuses. One ordinarily skilled in the art would understand that the invention is not specifically limited to the schematic diagram shown in FIG. 2 and is not limited to the detection of oxide breakdown. To the contrary, the invention is equally applicable to all device designs, all device reliability tests, and all in-line process control and screening that are capable of being tested using photon detection. As mentioned above, it is possible for good devices to emit light as well as failing devices, depending on bias conditions. Therefore, for non-breakdown light emission detection, usage of fuses is not necessary. With the invention shown in FIG. 2, devices 205 (e.g., capacitors, transistors, diodes, etc.) across the whole wafer are connected in parallel to form a matrix 215, with electronic fuses 200 (metal fuse or poly-Si fuse) at each ends or at one end only of the individual devices 205. In one embodiment, all devices are connected to a single voltage/current source 301 through one or more probing pads 210. For this specific designed macro, the fuses are permanently connected to the devices with very low initial resistance. During the device breakdown, the dielectric undergoes a catastrophic thermal run-a-way condition to form a conductive filament in the dielectric due to high current flow. This high current and self joule heating could cause the electromigration-like depletion or thermal rupture of the fuse material to induce fuse opens with extremely high post-programming resistance. Alternatively, the fuses could also be forced to open by an external controller with the feedback from the light emission detector. The fuses can be opened optically, by heat, electrically, or by any known means to open a fuse.

The purpose of the fuses 200 is to isolate failed devices from the array 215 after the device has suffered a breakdown (or shown some other type of defect). When a defective device is identified and removed (by opening appropriate fuses), the remaining non-defective devices (e.g., those devices which have not yet indicated a defective condition in the testing cycle) are continuously stressed without interruption. Blowing fuses will possibly result in light emission that might be high enough to mask or disrupt emission data that are being collected. In order to minimize this disruption, a selectable wavelength filter system is placed in front of the photon sensor. The light spectrum of blowing fuses (usually at IR region) is different from the spectrum of breaking down of oxide (usually at visible region). Therefore the specific wavelength filter system effectively removes all unwanted light emission such as from fuse blowing during the data collecting process. Furthermore, sophisticated spectral analysis software will screen out all "suspicious" light emissions (not from the real dielectric breakdown) during post-stress data analysis.

Figure 3:
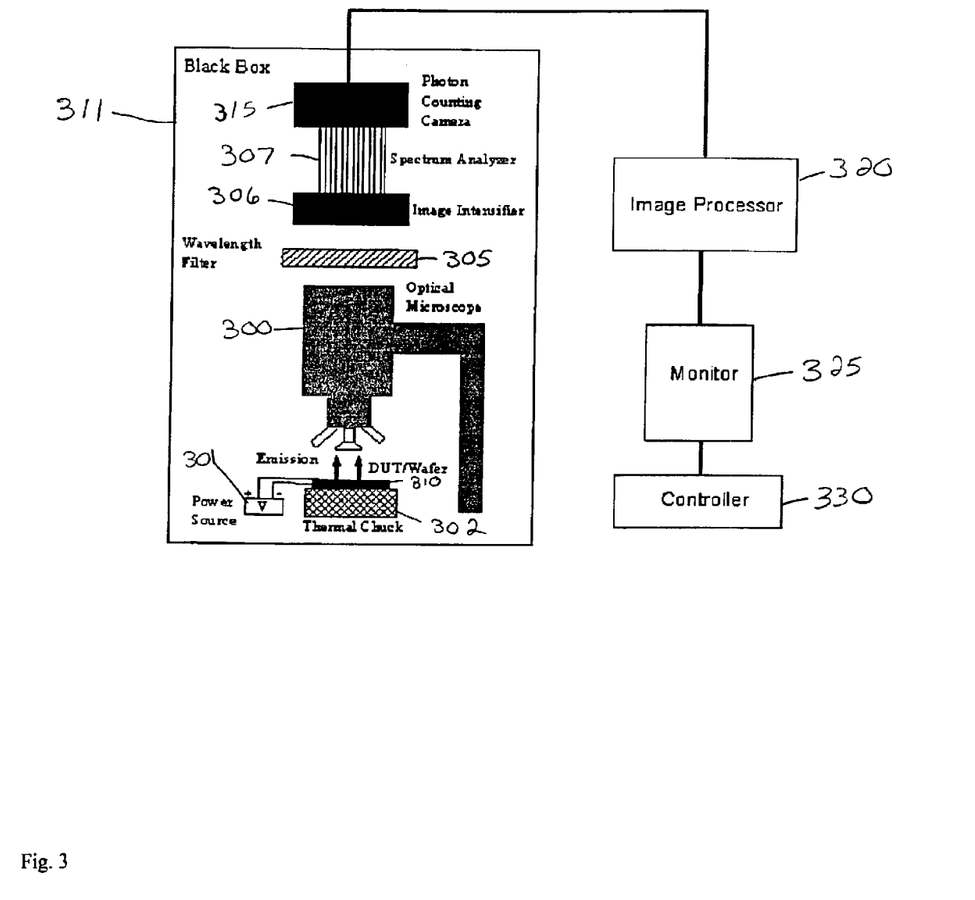
FIG. 3 is a schematic diagram of a photon detecting system according to the invention.

FIG. 3 illustrates one example of a system according to the invention. One ordinarily skilled in the art would understand that the invention is not specifically limited to the schematic diagram shown in FIG. 3. To the contrary, the invention is equally applicable to all similar systems that could perform photon emission defect identification. More specifically, FIG. 3 includes a power supply unit 301 which could supply one or more voltage and current levels for devices under test, a thermal chuck 302 with step function which holds and moves the wafer, and provides different temperatures, an optical microscope with a selectable lens system 300 including a unique wide-angle lens that views a whole wafer 310 at one time. A wavelength filter system 305 that is positioned between the optical microscope 300 and an image intensifier 306 that removes unwanted light emission. The whole system is placed in a light proof enclosure 311 for better light detection. In order to test the many devices on the wafer, a wide-angle optical lens or an array of integrated photon sensors is required. The wide-angle lens together with other normal optical lens with different magnifications are mounted onto the optical microscopy 300.

Upon application of current and/or voltage (e.g., a test bias), devices under test emit photons, as identified by the emission arrows shown emitting from the device under test 310 in FIG. 3. Since good devices also could emit light depending on bias conditions, the invention can also be used to evaluate the oxide thickness of different devices within the wafer. Under the same voltage, the thinner oxide emits more photons than the thicker oxide since the field across the thinner oxide is high. The same idea also can be applied to check the oxide thickness uniformity within the device based on the similar phenomenon. Another example is defect check. Abnormal devices with defects usually emit more photons at the defective sites than the normal devices. Methods of identifying defective devices using photon emissions are shown in U.S. Pat. Nos. 6,184,046; 5,981,967; and 4,845,425, all of which are incorporated herein by reference. There is a direct correlation between the sources of the emitted light and the location of the defective spots. The microscope optic system 300 is coupled to an image intensifier 306, which is in turn connected to a spectrum analyzer 307 and a photo counting camera 315, to determine the wavelength dependent photo intensity. An image processor 320 converts the signals from the photon counting camera 315 into some form of useful display on the monitor 325.

The controller 330 is connected to the monitor 325. The controller 330 controls the optics to get the best images and magnifications, and identifies the failure devices from the whole test matrix and open fuses. By opening the fuses, the defective devices are electrically disconnected from the electrical test bias. In doing so, the controller 330 selectively removes devices that have been identified as being defective from the array 315 being subjected to the test. The emission microscopy controller 330 monitors the light pattern emitted by devices across the whole wafer 315 during real-time stress testing and records a dynamic digital light emission movie of time-based images continuously. Breakdown spots are easily detected by the emission microscopy system during the stress testing and both the breakdown time and physical location of the breakdown spot are recorded and analyzed by the controller 330. The spatial map of the emission would correspond with the matrix of devices under the test on the chip. These images would then be processed against time-zero reference image standards to discern failing ones.

Figure 4:
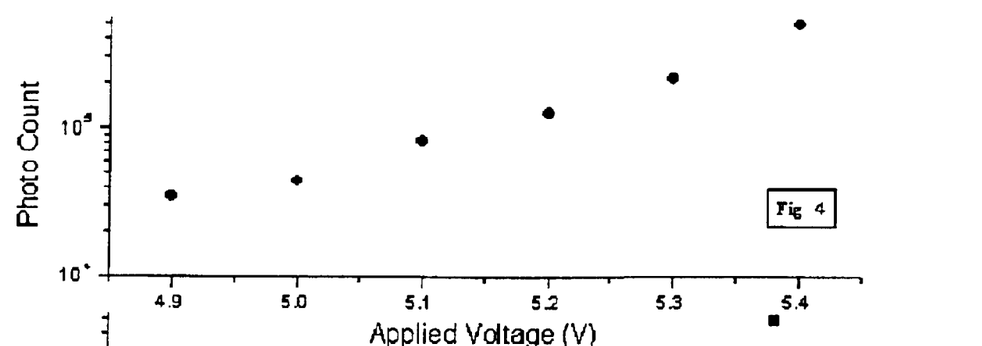
FIG. 4 is a graph showing the photon count as applied voltage is increased.
Figure 5:
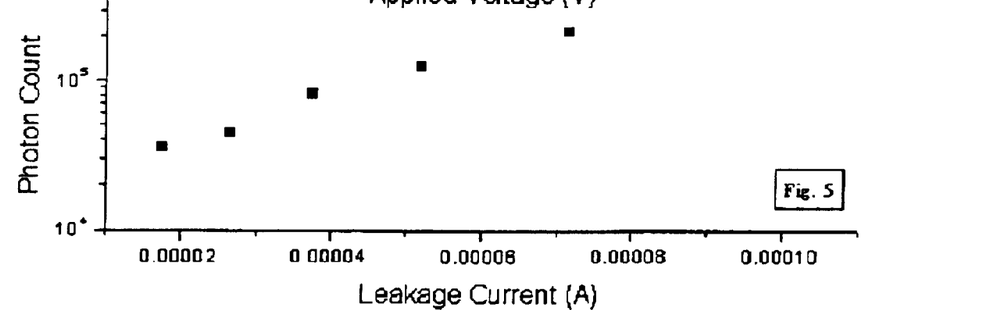
FIG. 5 is a graph showing the photon count as leakage current is increased.
Figure 6:
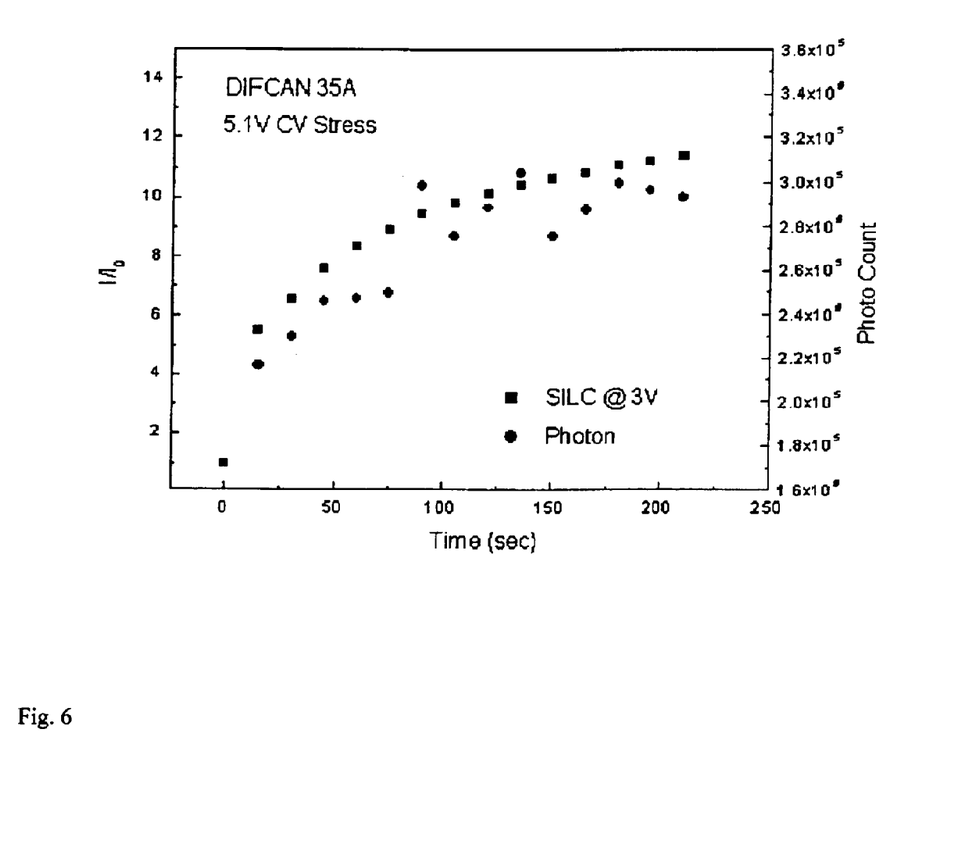
FIG. 6 is a graph showing the increase in photon count and current over time.

Although the leakage current during the constant voltage stress cannot be monitored for each device with this single voltage source approach, the photo emission has strong correlation with voltage and current as shown by comparing FIGS. 4 and 5. More specifically, FIG. 4 is a graph showing the photon count as applied voltage is increased and FIG. 5 is a graph showing the photon count as leakage current is increased. Further, time-dependent photo emissions also show good correlation to the stress induced leakage current as shown in FIG. 6.

The intrinsic breakdown is generally recognized as being due to degradation resulting from the accumulation of defects such as traps and broken bonds at the Si/SiO$_2$ interface and in the oxide, and it occurs when the amount of defects in the oxide is enough to form, in one point of the capacitor area, a percolative path between anode and cathode. The stress induced leakage current is generally a good indicator of the defect generation rate. As shown in FIG. 6, the time-dependent emitted photon has good correlation to the stress induced leakage current. Thus, the invention uses time-dependent photo emissions as a reliable monitor to detect the defect generation and oxide degradation during the testing cycle (e.g., oxide degradation process).

Figure 7A:
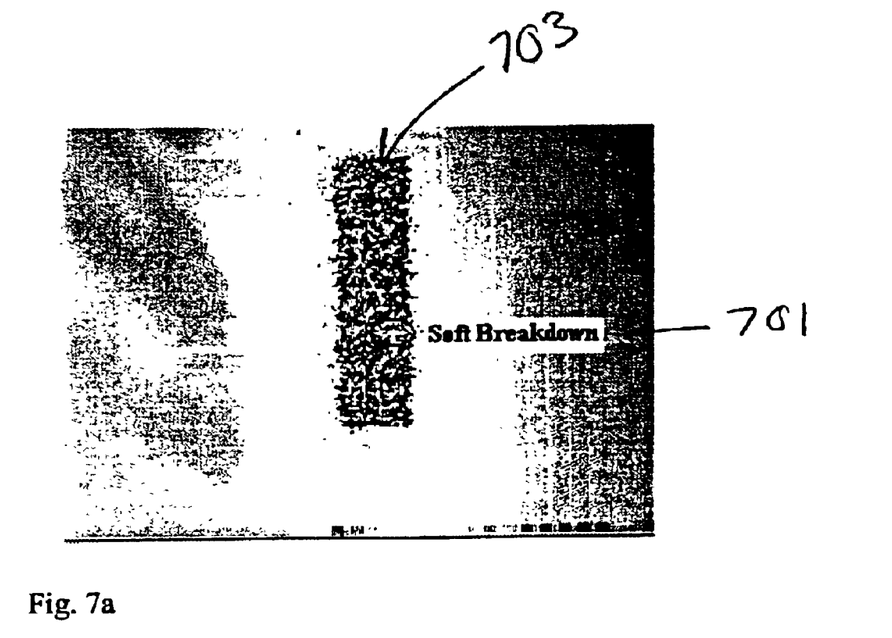
FIG. 7a is a schematic picture showing the soft breakdown spot within a device.
Figure 7B:
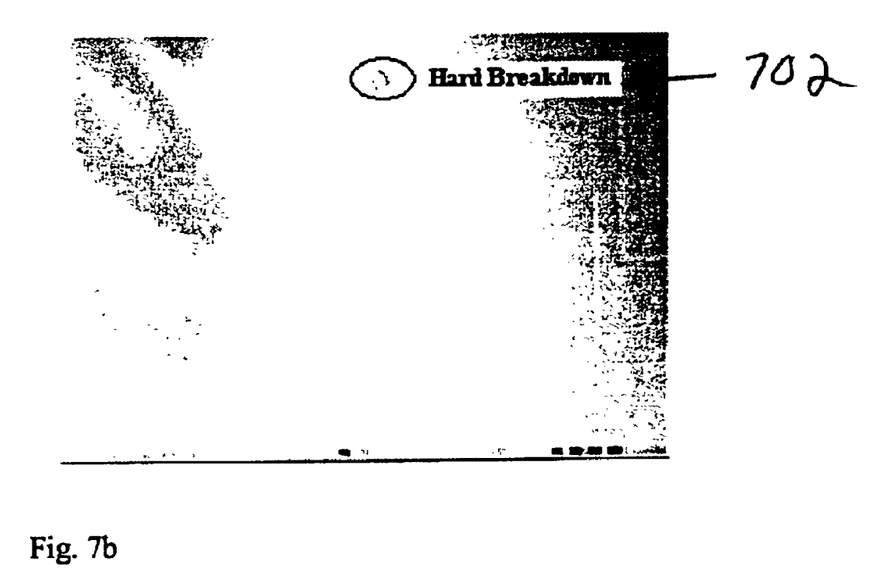
FIG. 7b is a schematic picture showing the hard breakdown within a device.

By using photo emission microscopy, soft and hard breakdown is also distinguished as shown in FIGS. 7a–7b. The defects, as mentioned above, act as stepping stones used by the carriers to tunnel through the oxide with high transmission probability. The large amount of the carriers with high energy from the cathode travel ballistically through the percolation path to the anode, and generate the electron-hole pairs which are proportional to the energy level of the carriers and to the size of the percolation path. Therefore, the intensity of the light emission and the size of the emission spots are critical to determine the nature of different oxide breakdown. If the breakdown occurs without thermal damage in the MOS structure and the percolation path size is relatively small, the breakdown is referred to as soft breakdown 701 as shown in FIG. 7a. Although the localized failure spot is the brightest light intensity in the picture, the rest of device still could emit the light 703 as current still tunnels through the rest of the device. On the contrary, if the breakdown presents the anode and cathode effectively in a short circuit, and the percolation path size is relatively large indicating hard breakdown 702. In a hard breakdown 702, all the current concentrates locally at the defective path and no light is emitted through the rest of the device as shown in FIG. 7b, since no current actually tunnels through the rest part of the device.

Figure 8:
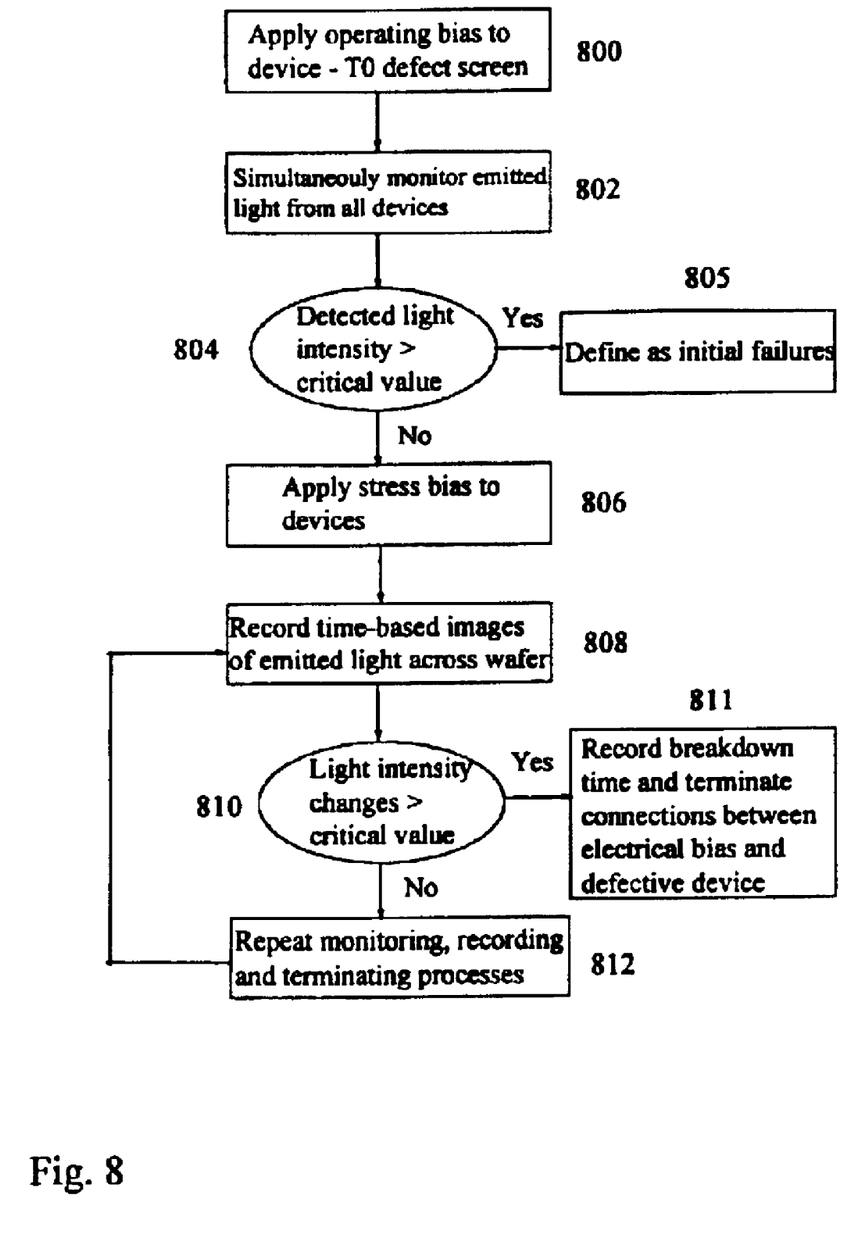
FIG. 8 is a flow diagram illustrating a preferred method of the invention.

FIG. 8 is a flowchart that shows the processing of the invention. First, in item 800, the invention applies an electrical bias at operating level to the devices. In item 802, the invention simultaneously monitors the emitted light from many devices across the wafer with low magnification wide angle lens. Next, in item 804, if the light emissions from some devices are detected above a predetermined critical value, those devices are defined as initial failures in item 805. Next, in item 806, the invention applies an electrical bias at a stress level to the devices. Next, in item 808, the invention records time-based images of the emitted light across the wafer. Next, in item 810, the invention determines the breakdown by analysis of emitted light by observing whether the light intensity changes to above the critical value. The invention records breakdown time and terminates connections between the electrical bias and the defective devices in item 811. In item 812, the invention repeats the monitoring and terminating processes during a duration of the testing. Lastly, the invention plots all the failure times in Weibull or log scale for reliability assessment. The invention also plots the wafer maps with the location of defective spots for each device and the time order of failure for each device across the wafer. The invention also controls the optics to exam specific failures with higher magnification lenses (e.g., at a single device level).

The invention produces many advantages compared to conventional systems. For example, the invention uses optical signals directly from the breakdown spot instead of indirect electrical signals from the whole device for breakdown detection. The invention produces massive parallel stresses that are exerted at the wafer level (without using a large number of power sources and probes). Light emission detection from a breakdown spot means more definitive and precise failure detection. Massive stress with a large sample size means better and more accurate reliability projection. Parallel stress testing reduces the time necessary to produce the final results. Therefore, without the cost of module building and module test equipment, this invention provides a more efficient method for oxide reliability stress testing.

Further, the invention is simple, reliable, and flexible. Less hardware is required and less mechanical movement is needed during wafer level testing. By monitoring the light emission patterns from the good devices, this invention is also useful with in-line control, process monitoring, and screening of devices, which offers more flexibility for different usage.

Also, the invention provides real-time dynamic stress information in a time-based manner and identifies the physical location of the breakdown events in a time-based manner. The invention provides a spectral analysis of the light emission at the breakdown sites to provide additional information regarding the nature of the oxide breakdown processes. Different dielectric quality and different failure modes (gate oxide breakdown, hot carrier, or junction fail) produce different spectrum curves. Hence, the photon spectrum analysis is effective for the determination of the material quality and failure mode during the stress testing. For example, if the photon intensity has an exponential relation with photon energy, the failure mode could be identified to be the hot carrier failure. If the photon intensity has a peak at certain photo energy, the failure mode is possibly oxide breakdown. Different dielectric films will have different photon spectrums during breakdown.

In other words, with the real-time image recording, the time of oxide breakdown, the location of breakdown, the change of the light emission intensity during the stress, and the spectral response of the emitted light from breakdown sites provide extensive information regarding oxide wearout and breakdown physics. With a single voltage source (for constant voltage stress) or current source (for constant current stress) which utilizes a simple and reliable setup with very limited hardware, fast massively parallel stress for oxide breakdown can be easily achieved. The present invention results in a more effective and a more precise method of liability assessment. Also, the present invention offers more flexibility for other applications.

Broadly speaking, the present invention contemplates a method for characterizing, stressing, and testing a device within an integrated circuit at the wafer-level. The method utilizes time-dependent light emission signals instead of electrical signals to detect and characterize the failures. The characterization, stress, and testing are applied to both front-end-of-line and back-end-of-line aspects such as oxide TDDB, device hot carrier, and metal wire electromigration. For hot carrier application, 2-D space-resolved photo emission profiles induced by hot carriers are analyzed to investigate the high-electric field effects in MOSFETs. For electromigration applications, significant joule heating induced by high currents and voids will emit far to middle IR photons, which are detected by photon detectors.

While the invention has been described in terms of preferred embodiments, those skilled in the art will recognize that the invention can be practiced with modification within the spirit and scope of the appended claims.

What is claimed is:

1. A method of testing devices on a wafer, said method comprising:

applying an electrical bias to said devices;

simultaneously monitoring emitted light from all of said devices, wherein said emitted light indicates times and locations of defective devices on said wafer;

recording time-based optical signals of said emitted light across said wafer; and mapping said device defects across said wafer on a time-line basis.

2. The method in claim 1, further comprising:

terminating connections between said electrical bias and said defective devices; and repeating said monitoring and said terminating during a duration of said testing.

3. The method in claim 2, wherein said terminating comprises opening fuses to electrically disconnect said defective devices from said electrical bias.

4. The method in claim 1, further comprising displaying said time-based optical signals during said testing.

5. The method in claim 1, further comprising connecting said devices in parallel on said wafer by using a single electrical power source.

6. The method in claim 1, further comprising connecting said devices in parallel on said wafer.

7. A method of testing devices on a wafer, said method comprising:

applying an electrical bias to said devices;

monitoring emitted light from said devices, wherein said emitted light indicates times and locations of defective devices;

mapping said device defects across said wafer on a time-line basis;

terminating connections between said electrical bias and said defective devices; and repeating said monitoring and said terminating during a duration of said testing.

8. The method in claim 7, wherein said monitoring comprises simultaneously monitoring emitted light from all of said devices.

9. The method in claim 7, further comprising recording time-based optical signals of said emitted light across said wafer.

10. The method in claim 7, further comprising connecting said devices in parallel on said wafer.

11. The method in claim 7, wherein said terminating comprises opening fuses to electrically disconnect said defective devices from said electrical bias.

12. A system for testing devices on a wafer, said system comprising:

a power source adapted to apply an electrical bias to said devices;

a photon camera adapted to detect emitted light photons from said devices;

an image processor adapted to convert said emitted light photons into emitted light signals;

a monitor adapted to simultaneously monitor all of said emitted light signals, wherein said emitted light signals indicate locations of defective devices; and a controller adapted to record time-based images of said emitted light photons across said wafer, wherein said controller is adapted to map said device defects across said wafer on a time-line basis.

13. The system in claim 12, wherein said controller is adapted to terminate connections between said electrical bias and said defective devices.

14. The system in claim 13, wherein, during a testing cycle:

said monitor continues to monitor said devices after said connections to said defective devices are terminated; and said controller continues to record said time-based optical signals and continues to terminate additional defective devices after said connections to said defective devices are terminated.

15. The system in claim 12, wherein said controller makes said time-based light emission signals available while said devices are being tested.

16. The system in claim 13, wherein said controller is adapted to open fuses to electrically disconnect said defective devices from said electrical bias.

17. The system in claim 12, wherein said devices are connected in parallel on said wafer.

* * * * *

UNITED STATES PATENT AND TRADEMARK OFFICE
CERTIFICATE OF CORRECTION

PATENT NO. : 6,788,093 B2
DATED : September 7, 2004
INVENTOR(S) : John M. Aitren et al.

It is certified that error appears in the above-identified patent and that said Letters Patent is hereby corrected as shown below:

<u>Title page,</u>
Item [75], Inventor, "John M. Aitren" should read -- John M. Aitken --

Signed and Sealed this

First Day of March, 2005

JON W. DUDAS
*Director of the United States Patent and Trademark Office*